(12) United States Patent
Mahurin et al.

(10) Patent No.: US 7,242,219 B1
(45) Date of Patent: Jul. 10, 2007

(54) CIRCUIT FOR PARITY TREE STRUCTURE

(75) Inventors: Eric W. Mahurin, Austin, TX (US); Dimitry Patent, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 112 days.

(21) Appl. No.: 11/221,638

(22) Filed: Sep. 8, 2005

(51) Int. Cl.
*G06F 7/50* (2006.01)
*H03K 19/21* (2006.01)
*H03K 5/22* (2006.01)

(52) U.S. Cl. .............................. 326/54; 326/52; 326/53; 326/55; 327/22; 327/23; 327/24; 327/25; 327/26; 327/27

(58) Field of Classification Search ............ 326/52–55; 327/22–27
See application file for complete search history.

(56) References Cited

U.S. PATENT DOCUMENTS

| | | | |
|---|---|---|---|
| 4,749,886 A * | 6/1988 | Hedayati ..................... | 326/55 |
| 4,968,903 A * | 11/1990 | Smith et al. .................. | 326/50 |
| 5,075,574 A | 12/1991 | Boudon | |
| 5,568,067 A * | 10/1996 | McDermott et al. .......... | 326/55 |
| 5,576,637 A * | 11/1996 | Akaogi et al. ................ | 326/55 |
| 5,592,107 A * | 1/1997 | McDermott et al. .......... | 326/49 |
| 6,137,309 A * | 10/2000 | Couteaux et al. ............. | 326/55 |
| 2002/0067186 A1* | 6/2002 | Tran et al. .................... | 326/52 |
| 2005/0253625 A1* | 11/2005 | Gliese et al. ................. | 326/41 |
| 2006/0181310 A1* | 8/2006 | Rhee ........................... | 326/54 |

* cited by examiner

*Primary Examiner*—Vibol Tan
*Assistant Examiner*—Dylan White
(74) *Attorney, Agent, or Firm*—Meyertons Hood Kivlin Kowert & Goetzel, P.C.; Erik A. Heter

(57) ABSTRACT

A circuit for a parity tree is disclosed. In one embodiment, a circuit for a parity tree includes a pull-up circuit, a pull-down circuit, and a cross-couple circuit. The circuit, an XOR/XNOR circuit, includes both an output node and an inverted output node. For a given set of input signals, a pull-up path exists through the cross-couple circuit for one of the output node and the inverted output node, and wherein a pull-down path exists through the cross-couple circuit for the other one of the output node and the inverted output node.

13 Claims, 2 Drawing Sheets

CIRCUIT FOR PARITY TREE STRUCTURE

BACKGROUND OF THE INVENTION

1. Field of the Invention

This invention relates to electronic systems, and more particular, to circuitry for implementing parity trees.

2. Description of the Related Art

Computers and other digital systems utilize parity circuits in order to detect the presence of errors in transferred data. When data is transmitted, one or more extra bits may be appended onto the transmitted data for error checking purposes. The bits may be appended such that there is an even or an odd number of logic ones (or zeros) in the data. A parity checking circuit may receive the transmitted data and check to ensure that the data includes the correct number of ones or zeros.

Parity is typically checked by parity tree. The size of a parity tree is dependent on the size of the data for which parity is being checked. Thus, as digital systems are designed to process greater data sizes (e.g., 64 bit processors), the corresponding growth of parity trees increases the number of logic gates necessary to implement them, and may thus slow down the error-checking process. Thus, implementing parity trees with slow circuitry may reduce the overall speed at which the system for which parity is being checked may operate.

SUMMARY OF THE INVENTION

A circuit for a parity tree is disclosed. In one embodiment, a circuit for a parity tree includes a pull-up circuit, a pull-down circuit, and a cross-couple circuit. The circuit, an XOR/XNOR circuit, includes both an output node and an inverted output node. For a given set of input signals, a pull-up path exists through the cross-couple circuit for one of the output node and the inverted output node, and wherein a pull-down path exists through the cross-couple circuit for the other one of the output node and the inverted output node.

In one embodiment, the pull-up circuit includes a first transistor coupled between a voltage node and an inverted output node, a second transistor coupled between the inverted output node and a first cross-couple node, and a third transistor coupled between the first cross-couple node and the voltage node. The pull-down circuit includes a fourth transistor coupled between the voltage node and an output node, a fifth transistor coupled between the output node and a second cross-couple node, and a sixth transistor coupled between the second cross-couple node and a ground node. The circuit is configured to receive a first inverted input on a gate terminal of each of the second and fifth transistors, and further configured to receive a second inverted input on a gate terminal of each of the third and sixth transistors. A cross-couple circuit includes a seventh transistor coupled between the output node and the first cross-couple node, an eighth transistor coupled between the inverted output node and the second cross-couple node, a ninth transistor coupled between the second cross-couple node and the voltage node, and a tenth transistor coupled between the first cross-couple node and the ground node. For any given set of input signals, the circuit is configured such that one of the output and inverted output nodes is pulled down to ground through the cross-couple circuit, while the other one of the output and inverted output nodes is pulled up to the voltage node through the cross-couple circuit. The circuit may attain faster operating speeds by pulling up one side of the circuit while pulling down the other side.

BRIEF DESCRIPTION OF THE DRAWINGS

Other aspects of the invention will become apparent upon reading the following detailed description and upon reference to the accompanying drawings in which.

Figure 1:
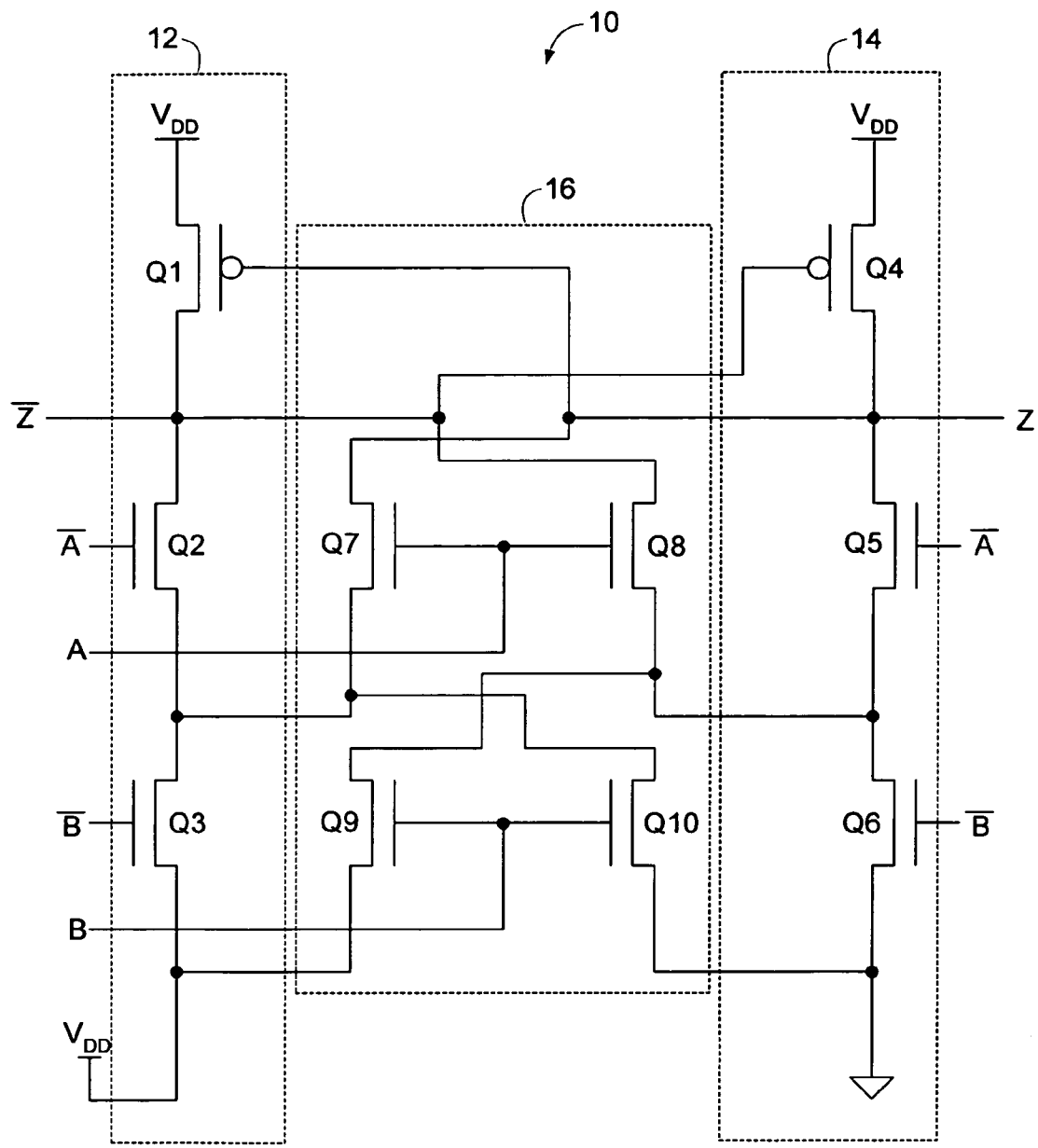
FIG. 1 is a schematic diagram of one embodiment of an XOR/XNOR gate.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Turning now to FIG. 1, a schematic diagram of one embodiment of an XOR/XNOR circuit is shown. In the embodiment shown, circuit 10 includes a pull-up circuit 12, a pull-down circuit 14, and a cross-couple circuit 16. Circuit 10 is configured to receive two inputs (A and B), as well as the complements of the two inputs (A-bar and B-bar). Circuit 10 is further configured to provide an output Z and a complement of the output Z-bar.

By virtue of having an output Z and its complement Z-bar, circuit 10 is configured to perform both an XOR and an XNOR function. Thus, circuit 10 is configured to provide a logic 0 on the output node (Z) and a logic 1 on the inverted output node (Z-bar) when both inputs A and B are of the same state (both logic 1's or both logic 0's), and further configured to provide a logic 1 on the output node and a logic 0 on the inverted output node when the inputs are of a different state with respect to each other (one input a logic 1, the other input a logic 0).

Pull-up circuit 12 includes first, second, and third transistors, respectively labeled Q1, Q2, and Q3. Transistor Q1 is coupled between the voltage node ($V_{DD}$) and the inverted output node Z-bar (as used herein, the term 'coupled between' indicates that the source-drain pathway [or drain-source pathway] is coupled between the listed nodes). Transistor Q2 is coupled between the inverted output node and a first cross-couple node, while transistor Q3 is coupled between the first cross-couple node and the voltage node. Pull-up circuit 12 is configured to pull up an output signal present on either the output node Z or the inverted output Z-bar to approximately the voltage level $V_{DD}$ through cross-couple circuit 16. More particularly, the output signal is pulled up at the point in the circuit of the voltage node connection to transistor Q3. If an output signal on the inverted node Z-bar is a logic 1 (i.e. logic high), it may also be pulled up through transistor Q1, while transistor Q4 may be used to pull up a logic 1 output signal on the output node Z. In the embodiment shown, transistors Q1 and Q4 are PMOS transistors, while each of the remaining transistors are NMOS transistors. Embodiments utilizing different types of transistors are possible and contemplated.

Pull-down circuit 14 includes fourth, fifth, and sixth transistors, respectively labeled Q4, Q4, and Q6. Transistor Q4 is coupled between the voltage node and the output node Z, transistor Q5 is coupled between the output node and a second cross-couple node, and transistor Q6 is coupled between the second-cross-couple node and a ground node. Pull-down circuit 14 is configured to pull down an output signal present either on the output node or the inverted output node through cross-couple circuit 16. More particularly, the output signal on either the output node or the inverted output node is substantially pulled down to ground potential through either transistor Q6 or transistor Q10. Circuit 10 is configured such that, during circuit operations, one of output node Z and inverted output node Z-bar is pulled up while the other one of Z and Z-bar is pulled down.

Cross-couple circuit 16 includes seventh, eighth, ninth, and tenth transistors, labeled respectively as Q7, Q8, Q9 and Q10. Transistor Q7 is coupled between the output node Z and the first cross-couple node, while transistor Q8 is coupled between the inverted output node Z-bar and the second cross-couple node. Transistor Q9 is coupled between the second cross-couple node and the voltage node, while transistor Q10 is coupled between the first cross-couple node and the ground node. Cross-couple circuit 16 may provide a pull-up path to the voltage node and a pull-down path to the ground node through these transistors. The specific pull-up and pull-down paths for various input and output signal states will be discussed in further detail below.

Circuit 10 is configured to receive input signals on a first input A and a second input B, as well as complements of each of these input signals on inputs A-bar and B-bar. Circuit 10 is configured such that, when operational, an input signal is received on input A, which is coupled to the gate terminals of transistors Q7 and Q8, while a second input signal is received on input B, which is coupled to the gate terminals of transistors Q9 and Q10. The input A-bar, which includes the gate terminals of transistors Q2 and Q5, may receive an input signal that is a logical complement to that received on input A. Similarly, the input B-bar, which includes the gate terminals of transistors Q3 and Q6, may receive an input signal that is a logical complement to that received on input B.

Although not explicitly shown, some embodiments may include inverter circuits in order to generate the complements of input signals received on inputs A and B. In other embodiments, separate circuitry may be used to generate the complements of input signals received on inputs A and B prior to them being received by circuit 10. Furthermore, circuitry to which circuit 10 is to be coupled may be configured to generate the complements of the input signals received on inputs A and B, with inverters (either separate or part of circuit 10) generating the actual signals received on inputs A and B.

Circuit 10 is configured to provide a pull-up path between one of the output nodes (Z, Z-bar) through at least a portion of pull-up circuit 12 depending on the state of the input signals. Similarly, for the same given state of the input signals, circuit 10 is configured to provide a pull-down path for the other one of the output nodes through at least a portion of pull-down circuit 14. For certain combinations of the input signals, the pull-up and pull-down paths may pass through cross-couple circuit 16.

When input signals received on inputs A and B are both at logic low levels (and thus the input signals on inputs A-bar and B-bar are both at logic high levels), transistors Q2, Q3, Q5 and Q6 are all turned on, while transistors Q7, Q8, Q9 and Q10 will all be turned off. Since transistors Q5 and Q6 are on for this combination of input signals, a pull-down path exists between output node Z and ground, and thus the output present on the output node will be a logic low level. Similarly, since transistors Q2 and Q3 are on for this combination of input signals, a pull-up path exists between output node Z-bar and the voltage node $V_{DD}$. Furthermore, since the output node Z is pulled down, the gate terminal of transistor Q1 is also pulled down, and thus Q1 is turned on, thereby adding another pull-up path between output node Z-bar and voltage node $V_{DD}$. Since output node Z-bar is pulled high through both Q1 as well as through Q2 and Q3, a logic low level exists on the gate terminal of Q4, and thus it remains off for this combination of input signals.

Circuit 10 is configured to produce the same combination of output signals (output node Z-bar a logic high and output node Z a logic low) when the input signals on both inputs A and B are logic high levels (with the input signals on the A-bar and B-bar inputs both logic low levels). When the input signals received on both of inputs A and B are at logic high levels, transistors Q7, Q8, Q9 and Q10 will be turned on, while transistors Q2, Q3, Q5 and Q6 will be turned off (due to logic low levels being present on the inputs A-bar and B-bar). For this combination of input signals, a pull-down path exists between output node Z and ground through transistors Q7 and Q10, while a pull-up path between output node Z-bar and voltage node $V_{DD}$ exists through transistors Q8 and Q10. Thus, for this combination of input signals, a signal on output node Z will be pulled to a logic low level while a signal on the output node Z-bar will be pulled to a logic high. Additional pull-up strength for the logic high signal present on output node Z-bar is provided by virtue of the fact that transistor Q1 is turned on due to the logic low level on output node Z (and thus on the gate terminal of Q1).

When input signals received on inputs A and B are of opposite states with respect to each other, the pull-up and pull-down paths pass through cross-couple circuit 16. When an input signal received on input A is at a logic low level while an input signal received on input B is at a logic high level, transistors Q2, Q5, Q9 and Q10 are turned on, while transistors Q3, Q6, Q7 and Q8 are turned off. The pull-down path for this combination of input signals exists between output node Z-bar and ground through transistors Q2 and Q10. A pull-up path for this combination of input signals exists between output node Z and voltage node $V_{DD}$ through transistors Q5 and Q9. An additional pull-up path present through transistor Q4, which is turned on due to the logic low level present on output node Z-bar (and thus on its gate terminal). Thus for this combination of input signals, an output signal present on output node Z will be at a logic high level while an output signal present on the output node Z-bar will be at a logic low level. Since a logic high level is present on the output node Z, transistor Q1 will be turned off.

If the states of the input signals are reversed (A=1, B=0, A-bar=0, B-bar=1), transistors Q7, Q8, Q3 and Q6 will be turned on, while transistors Q2, Q5, Q9 and Q10 will be turned off. For this combination of input signals, an output signal present on output node Z will be pulled up by voltage node $V_{DD}$ through transistors Q7 and Q3. An additional pull-up path for this combination of input signals exists through transistor Q4, which is turned on as a result of a logic low level on output node Z-bar (and thus Q4's gate terminal). The signal present on the output node Z-bar is pulled down by the ground node through transistors Q8 and Q6.

Thus, each combination of input signals results in one output signal being pulled up while the other output signal is pulled down. This combination of a pulling up one side of the circuit (and thus one output) while pulling down the other side (and thus the other output) may result in a circuit having a faster switching time.

Figure 2:
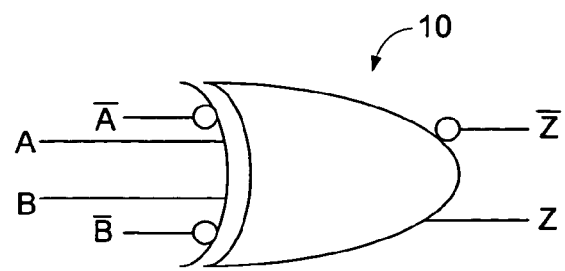
FIG. 2 is a symbol diagram of the embodiment of the XOR/XNOR gate illustrated by the schematic of FIG. 1.

FIG. 2 is a symbol diagram of the embodiment of the XOR/XNOR gate illustrated by the schematic of FIG. 1. In the embodiment shown, the logic symbol diagram of circuit 10 includes inputs A and B for receiving first and second input signals, respectively. The logic symbol for circuit 10 also includes inputs A-bar and B-bar for receiving the complements of the first and second input signals, respectively. Finally, the logic symbol for circuit 10 includes outputs Z and Z-bar for providing an output signal and an inverted output signal. As previously noted, circuit 10 is configured to provide either (or both) an exclusive-OR (XOR) function or an exclusive-NOR (XNOR) function. Table 1 below is a truth table illustrating the logical function of circuit 10.

TABLE 1

| A | B | A-bar | B-bar | Z | Z-bar |
|---|---|-------|-------|---|-------|
| 0 | 0 | 1 | 1 | 0 | 1 |
| 0 | 1 | 1 | 0 | 1 | 0 |
| 1 | 0 | 0 | 1 | 1 | 0 |
| 1 | 1 | 0 | 0 | 0 | 1 |

It should be noted that, for the purposes of this table, a logic 1 is equated to a logical high level while a logic 0 is equated to a logical low level. However, embodiments with assertion levels different than that shown here are also possible and contemplated.

Figure 3:
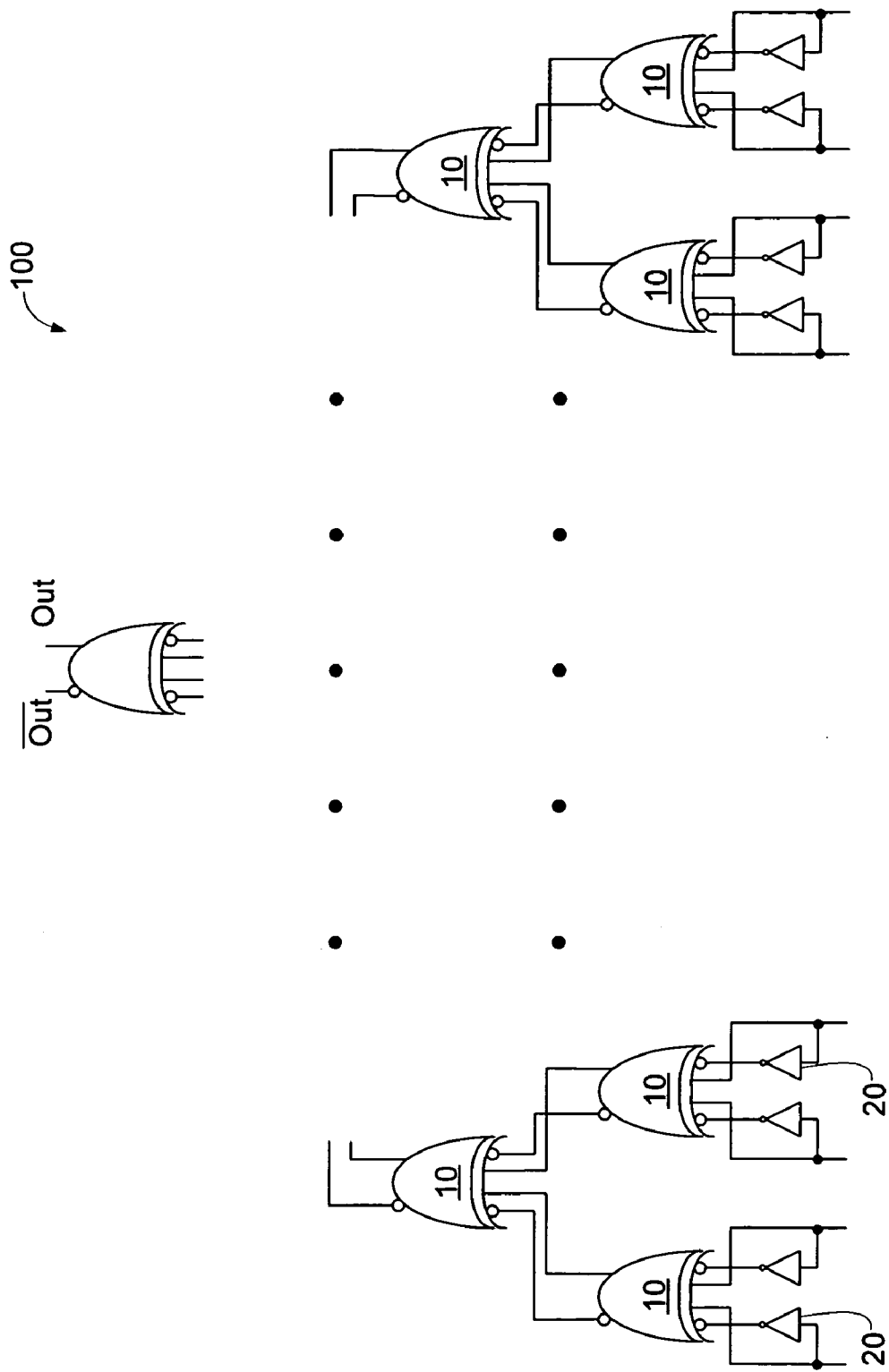
FIG. 3 is a logic diagram of a portion of one embodiment of a parity tree implemented using the XOR/XNOR gate of FIG. 1 and FIG. 2.

Moving now to FIG. 3, a logic diagram of a portion of one embodiment of a parity tree implemented using the XOR/XNOR gate of FIG. 1 and FIG. 2 is shown. In the embodiment shown, parity tree 100 includes a plurality of circuits 10, which may be the same or a similar embodiment to that discussed above in reference to FIG. 1 and FIG. 2. Thus, each circuit 10 may include a pair of inputs for receiving a pair of input signals, a complementary pair of inputs for receiving complements of the input signals, an output and a complementary output. Inverters 20 may be coupled to each of the complementary inputs of a first level of circuits 10 in order to provide the complementary signals necessary for these inputs. However, in subsequent levels of circuits 10, the use of inverters may be eliminated since each of circuits 10 is configured to provide both an output signal and a complementary output signal.

Broadly speaking, the number of circuits 10 necessary to implement parity tree 100 is dependent upon the data size for which parity is being checked. If the data size is 64 bits, then parity tree 100 may be implemented with 63 instances of circuit 10. Furthermore, a 64-bit implementation will require six levels of circuits 10. Thus, use of a fast switching circuit such as an embodiment of circuit 10 may be particularly useful in a parity tree such as the one partially illustrated here, and may thus prevent such a parity tree from becoming a bottleneck.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A circuit for a parity tree, the circuit comprising:
a pull-up circuit, wherein the pull-up circuit includes a first transistor coupled between a voltage node and an inverted output node, a second transistor coupled between the output node and a first cross-couple node, and a third transistor coupled between the first cross couple node and the voltage node;
a pull-down circuit, wherein the pull-down circuit includes a fourth transistor coupled between the voltage node and an output node, a fifth transistor coupled between the output node and a second cross-couple node, and a sixth transistor coupled between the second cross-couple node and a ground node; and
a cross-couple circuit coupled between the pull-up circuit and the pull-down circuit;
wherein for a given combination of input signals, a pull-up path exists between one the output node and the inverted output node and the voltage node through at least a portion of the pull-up circuit, and wherein a pull-down path exists between the other one of the output node and the inverted output node and the ground node through at least a portion of the pull-down circuit.

2. The circuit as recited in claim 1, wherein the cross-couple circuit includes a seventh transistor coupled between the output node and the first cross-couple node, an eighth transistor coupled between the inverted output node and the second cross-couple node, a ninth transistor coupled between the second cross-couple node and the voltage node, and a tenth transistor coupled between the first cross-couple node and the ground node.

3. The circuit as recited in claim 2, wherein the circuit is configured to receive a first input signal on a gate terminal of each of the seventh and eighth transistors and a second input signal on a gate terminal of each of the ninth and tenth transistors.

4. The circuit as recited in claim 3, wherein the circuit is configured to receive a logical complement of the first input signal on a gate terminal of the second transistor and a gate terminal of fifth transistor, and further configured to receive a logical complement second input signal on a gate terminal of the third transistor and a gate terminal of the sixth transistor.

5. The circuit as recited in claim 4, wherein for a first combination of input signals, the pull-up path exists between the inverted output node and the voltage node through second and third transistors and an additional pull-up path exists through the first transistor, and wherein a pull-down path exists between the output node and ground through fifth and sixth transistors, wherein each of the first and second input signals are at logic low levels in the first combination.

6. The circuit as recited in claim 4, wherein for a second combination of input signals, the pull-up path exists between the inverted output node and the voltage node through the eighth and ninth transistors and an additional pull-up path exists through the first transistor, and wherein the pull-down path exists between the output node and the ground node through the seventh and tenth transistors, wherein each of the first and second input signals are at logic high levels in the second combination of input signals.

7. The circuit as recited in claim 4, wherein for a third combination of input signals, the pull-up path exists between the output node and the voltage node through the fifth and ninth transistors and an additional pull-up path exists through the fourth transistor, and wherein the pull-down path exists between the inverted output node and the ground node through the second and tenth transistors, wherein the first input signal is at a logic low level and the second input signal is at a logic high level for the third combination.

8. The circuit as recited in claim 4, wherein for a fourth combination of input signals, the pull-up path exists between the output node and the voltage node through the third and seventh transistors and an additional pull-up path exists through the fourth transistor, and wherein the pull-down path exists between the inverted output node and the ground node through the sixth and the eighth transistors, wherein the first input signal is at a logic high level and the second input signal is at a logic low level for the fourth combination.

9. The circuit as recited in claim 1, wherein the first and fourth transistors are PMOS transistors, and wherein the second, third, fifth, sixth, seventh, eighth, ninth, and tenth transistors are NMOS transistors.

10. The circuit as recited in claim 1, wherein the circuit provides an exclusive-OR (XOR) and an exclusive-NOR (XNOR) function.

11. A parity tree circuit comprising:
a plurality of XOR/XNOR gates, wherein each of the XOR/XNOR gates includes:
  a pull-up circuit, wherein the pull-up circuit includes a first transistor coupled between a voltage node and an inverted output node, a second transistor coupled between the output node and a first cross-couple node, and a third transistor coupled between the first cross couple node and the voltage node;
  a pull-down circuit, wherein the pull-down circuit includes a fourth transistor coupled between the voltage node and an output node, a fifth transistor coupled between the output node and a second cross-couple node, and a sixth transistor coupled between the cross-couple node and a ground node; and
  a cross-couple circuit coupled between the pull-up circuit and the pull-down circuit;
  wherein for a given combination of input signals, a pull-up path exists between one the output node and the inverted output node and the voltage node through at least a portion of the pull-up circuit, and wherein a pull-down path exists between the other one of the output node and the inverted output node and the ground node through at least a portion of the pull-down circuit;
  wherein one of the output node and the inverted output node of all but one of the plurality of XOR/XNOR circuits is coupled to an input node of another one of the plurality of XOR/XNOR circuits.

12. The parity tree as recited in claim 11, wherein the cross-couple circuit of each of the plurality of XOR/XNOR circuits includes a seventh transistor coupled between the output node and the first cross-couple node, an eighth transistor coupled between the inverted output node and the second cross-couple node, a ninth transistor coupled between the second cross-couple node and the voltage node, and a tenth transistor coupled between the first cross-couple node and the ground node.

13. The parity tree as recited in claim 11, wherein each of the plurality of XOR/XNOR circuits is coupled to receive a first input on a gate terminal of each of the seventh and eighth transistors, a second input on a gate terminal of each of the ninth and the tenth transistors, a complement of the first input on a gate terminal of each of the second and fifth transistors, and a complement of the second input on a gate terminal of each of the third and sixth transistors.

* * * * *